US 6,501,654 B2

(12) United States Patent
O'Connor et al.

(10) Patent No.: US 6,501,654 B2
(45) Date of Patent: Dec. 31, 2002

(54) MICROFLUIDIC DEVICES FOR HEAT TRANSFER

(75) Inventors: Stephen D. O'Connor, Pasadena, CA (US); Eugene Dantsker, Sierra Madre, CA (US)

(73) Assignee: Nanostream, Inc., Pasadena, CA (US)

( * ) Notice: Subject to any disclaimer, the term of this patent is extended or adjusted under 35 U.S.C. 154(b) by 0 days.

(21) Appl. No.: 09/964,742

(22) Filed: Sep. 28, 2001

(65) Prior Publication Data

US 2002/0039280 A1 Apr. 4, 2002

Related U.S. Application Data

(60) Provisional application No. 60/236,838, filed on Sep. 29, 2000.

(51) Int. Cl.$^7$ ................................................. H05K 7/20
(52) U.S. Cl. ..................... 361/699; 361/698; 361/704; 361/707; 361/718; 361/719; 257/714; 174/15.1; 165/80.4
(58) Field of Search ................................. 361/688–692, 361/696–704; 257/706, 714, 715, 721, 722; 174/15.1, 15.2; 165/80.4, 104.33

(56) References Cited

U.S. PATENT DOCUMENTS

| | | | | |
|---|---|---|---|---|
| 4,758,926 A | * | 7/1988 | Herrell et al. ............... | 361/699 |
| 4,775,574 A | * | 10/1988 | Fukushima et al. ......... | 428/209 |
| 5,099,311 A | * | 3/1992 | Bonde et al. .................. | 357/82 |
| 5,099,910 A | * | 3/1992 | Walpole et al. ............. | 165/80.4 |
| 5,199,487 A | * | 4/1993 | DiFrancesco et al. ....... | 165/168 |
| 5,268,812 A | * | 12/1993 | Conte .......................... | 361/698 |
| 5,606,201 A | | 2/1997 | Lutz ............................. | 257/714 |
| 5,606,239 A | * | 2/1997 | Schumann .................... | 320/3 |
| 5,727,618 A | * | 3/1998 | Mundinger et al. ......... | 165/80.4 |
| 5,763,951 A | * | 6/1998 | Hamilton et al. ............ | 257/714 |
| 5,835,345 A | * | 11/1998 | Staskus et al. .............. | 361/699 |
| 5,863,502 A | | 1/1999 | Southgate et al. ............ | 422/58 |
| 5,870,823 A | * | 2/1999 | Bezama et al. ............... | 29/848 |
| 5,901,037 A | * | 5/1999 | Hamilton et al. ........... | 361/699 |
| 5,998,240 A | * | 12/1999 | Hamilton et al. ........... | 438/122 |
| 6,074,725 A | | 6/2000 | Kennedy ..................... | 428/188 |
| 6,129,973 A | | 10/2000 | Martin et al. ............... | 428/166 |
| 6,186,660 B1 | * | 2/2001 | Kopf-Sill et al. ........... | 366/340 |
| 6,264,900 B1 | | 7/2001 | Schubert et al. ............ | 422/224 |
| 6,337,794 B1 | * | 1/2002 | Agonafer et al. ........... | 361/690 |

FOREIGN PATENT DOCUMENTS

| | | | | |
|---|---|---|---|---|
| WO | WO 98/03997 | 1/1998 | ......... | H01L/23/473 |
| WO | WO 98/54941 | 12/1998 | ............ | H05K/7/20 |
| WO | WO 99/19717 | 4/1999 | .......... | G01N/25/22 |
| WO | WO 99/60397 | 11/1999 | ......... | G01N/33/483 |
| WO | WO 00/23753 | 4/2000 | ............. | F25B/1/00 |

OTHER PUBLICATIONS

Grodzinski, Piotr, "Development of Plastic Microfluidic Devices for Sample Preparation," BioMEMS 2000, Columbus, OH, Sep. 24, 2000.

Goodson, et al., "Electrokinetically-Pumped Two-Phase Heat Exchangers," (Web document) http://www.stanford.edu/group/microheat/hex.html, undated—downloaded Jul. 31, 2000.

Longtin, J.P., et al., "A One-Dimensional Model of a Micro Heat Pipe During Steady-State Operation," Journal of Heat Transfer, vol. 116, No. 3, pp. 709–715, Aug. 1994.

* cited by examiner

*Primary Examiner*—Boris Chervinsky
(74) *Attorney, Agent, or Firm*—Vincent K. Gustafson; Michael F. Labbee

(57) ABSTRACT

In accordance with the present invention there is provided a microfluidic heat exchange system for cooling heat-generating components of electronic equipment, computers, lasers, analytical instruments, medical equipment and the like. Both direct contact and indirect contact microfluidic systems are described. Also described are microfluidic systems that incorporate remote heat rejection systems that may be located outside the body of the equipment that contains the heat generating components that need cooling.

10 Claims, 11 Drawing Sheets

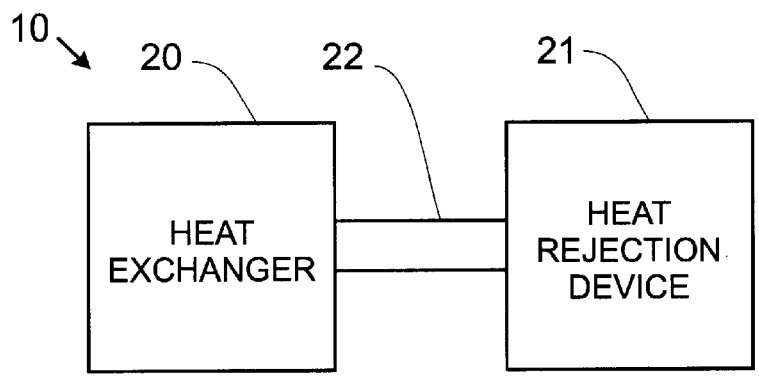
FIG._1A
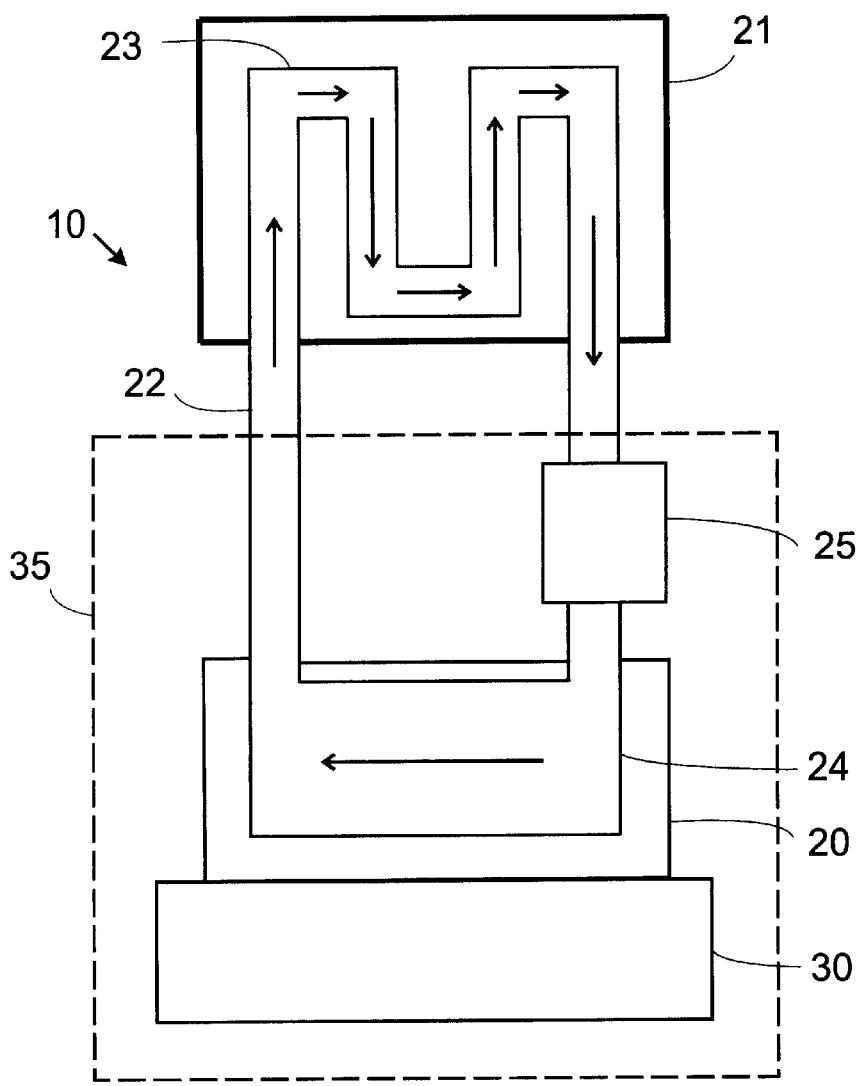
FIG._1B

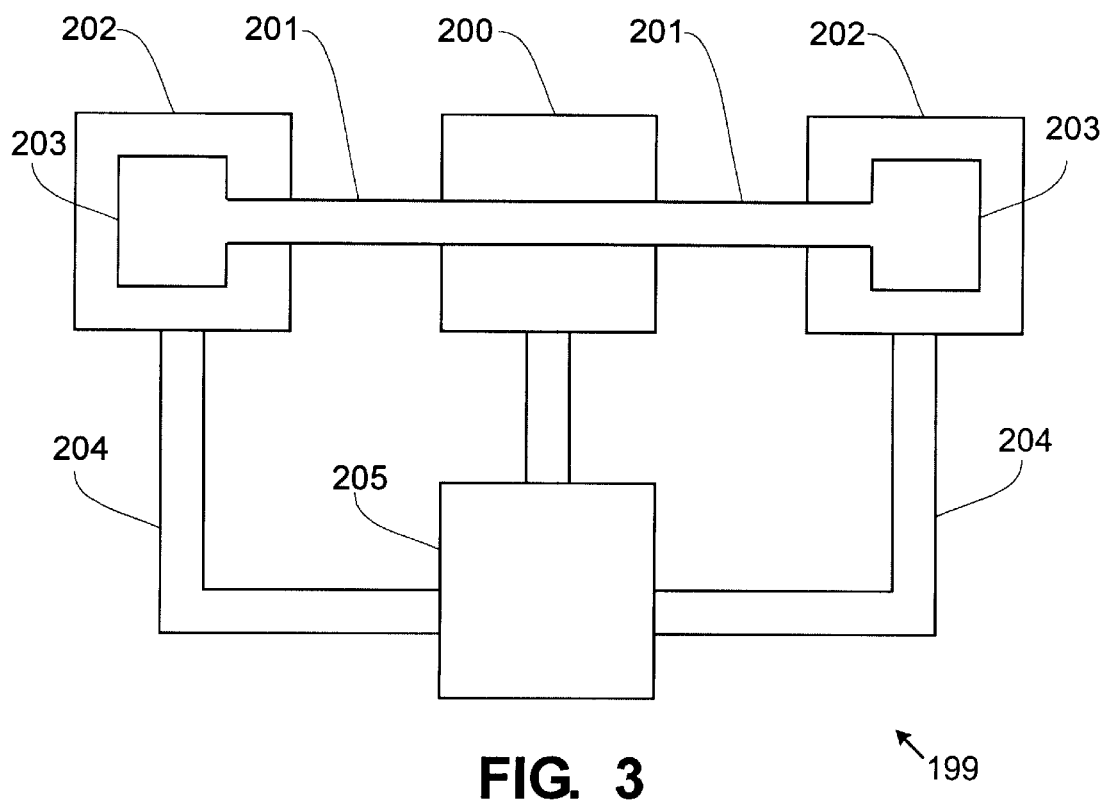
FIG._3

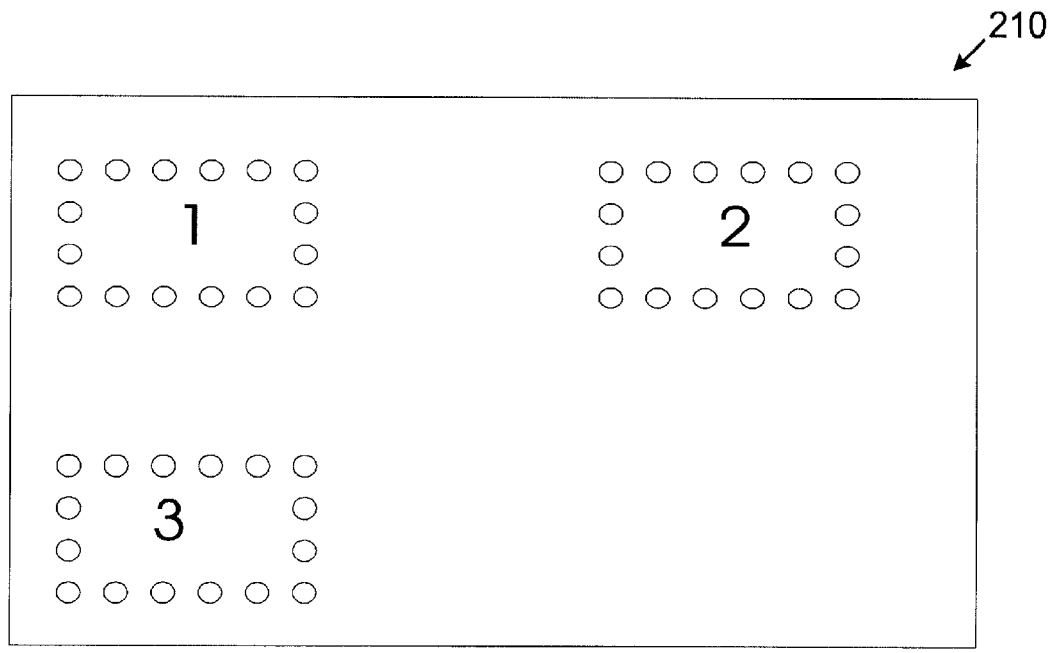
FIG._4A
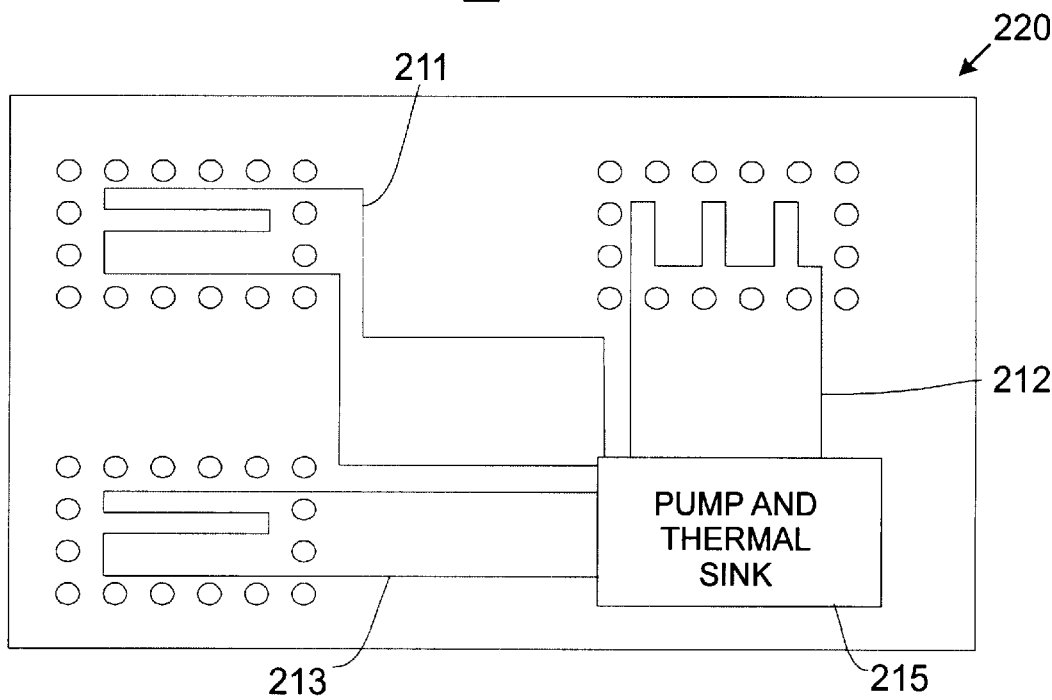
FIG._4B

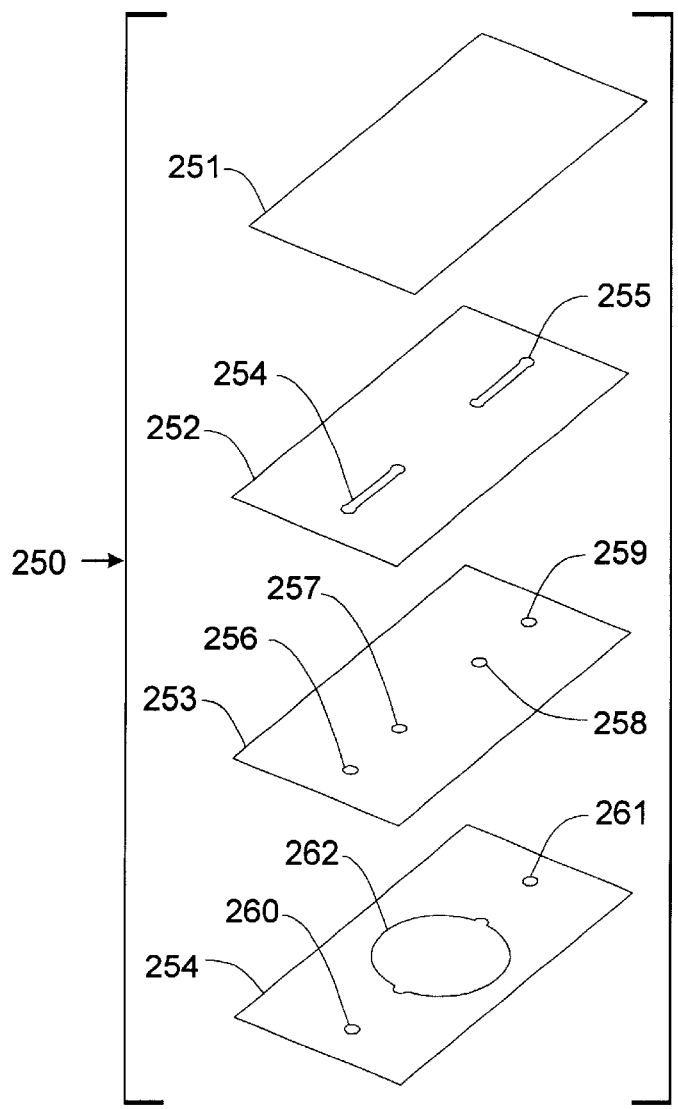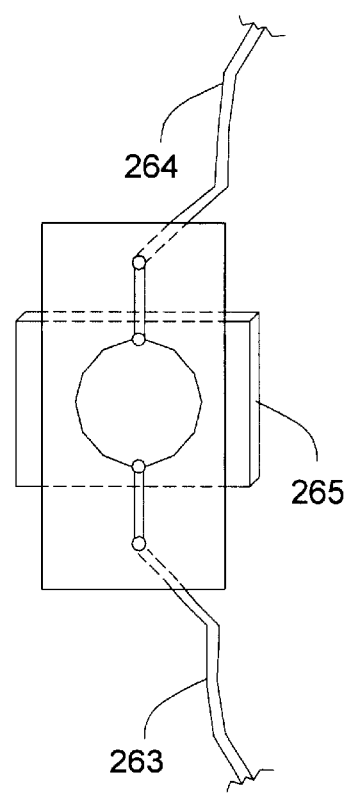
FIG._5A
FIG._5B

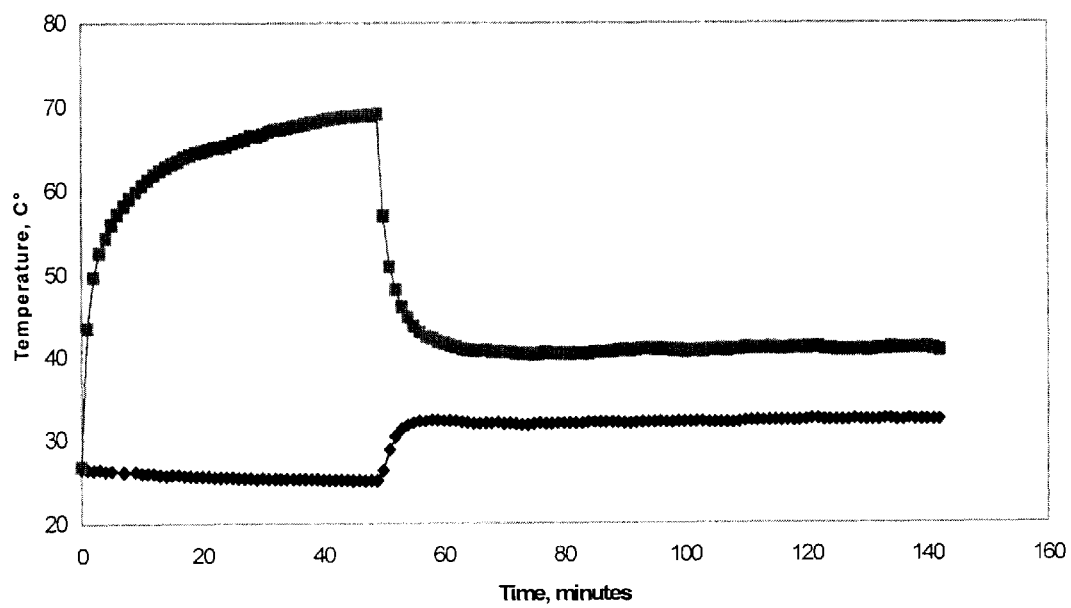
FIG._6

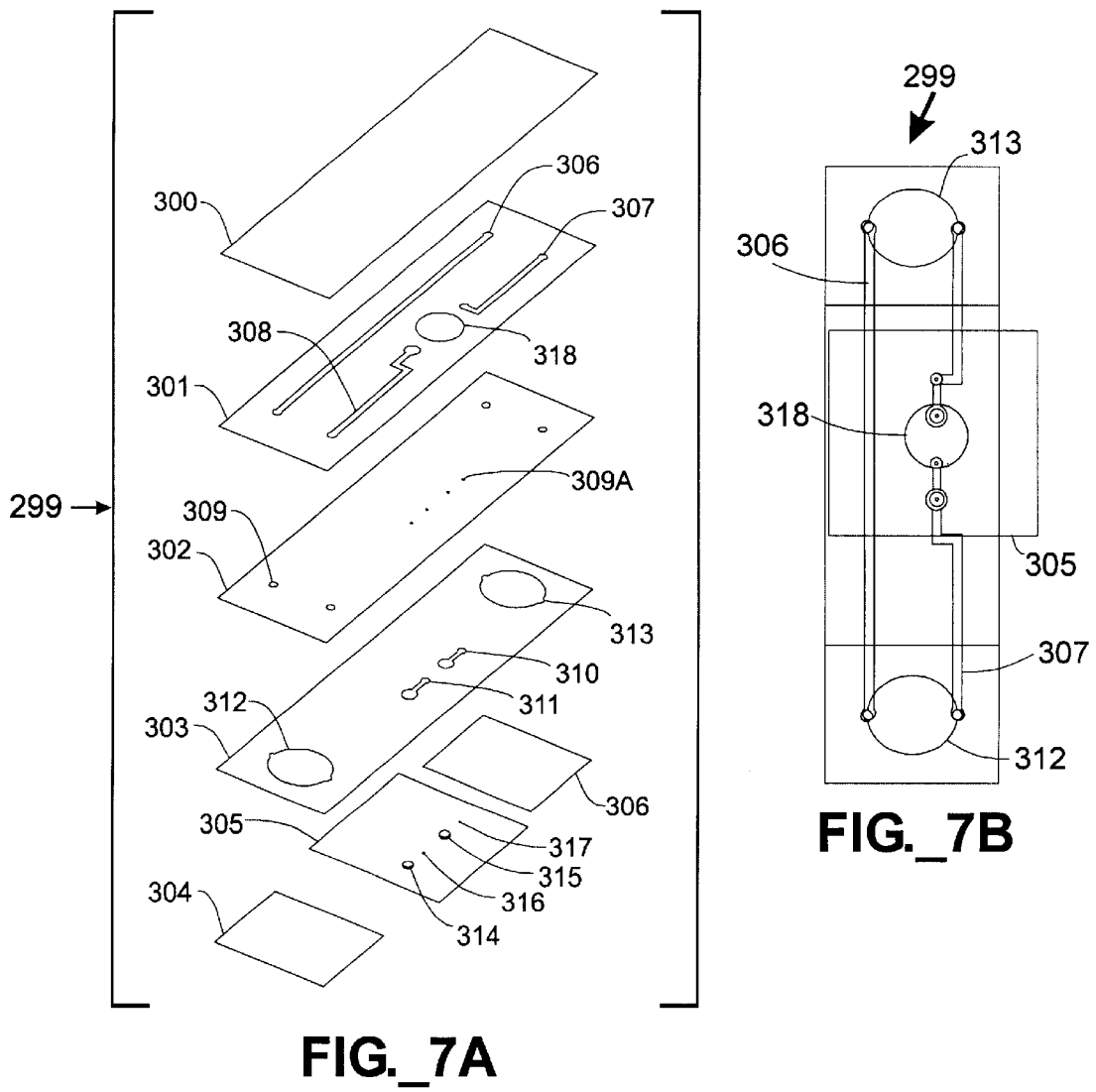
FIG._7A
FIG._7B

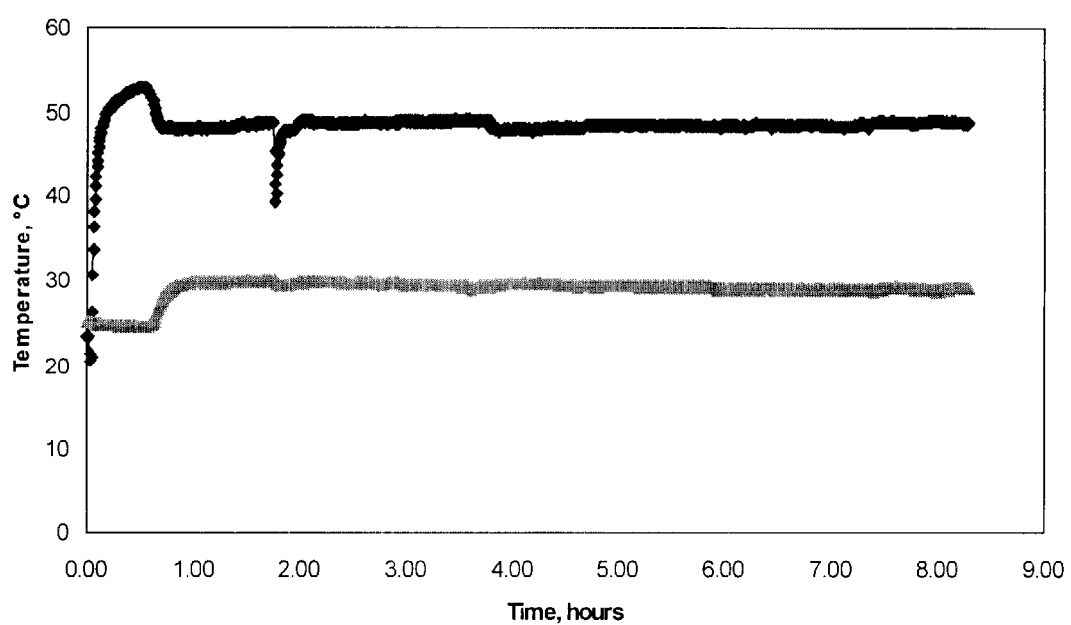
FIG._8

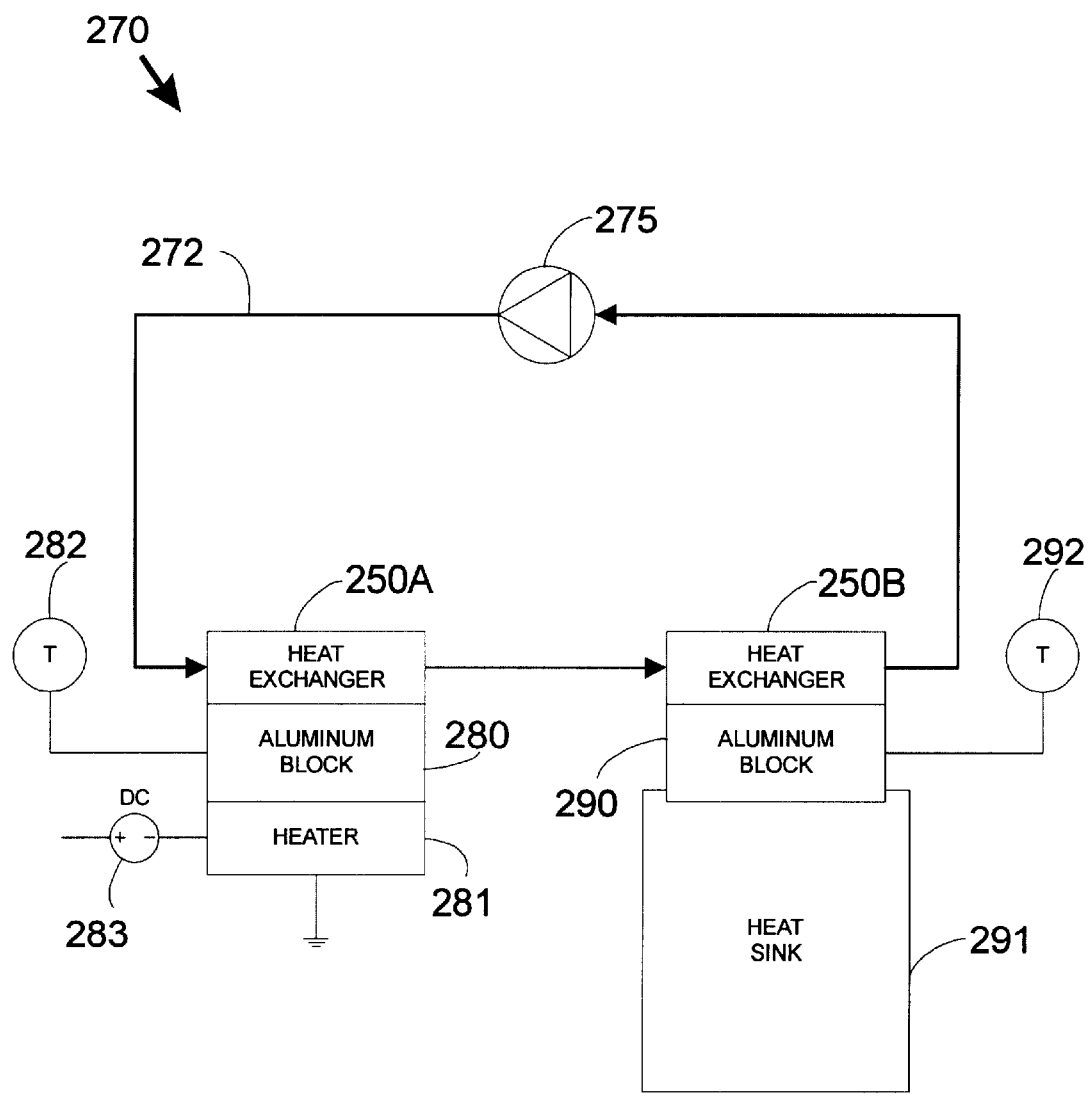
FIG._9

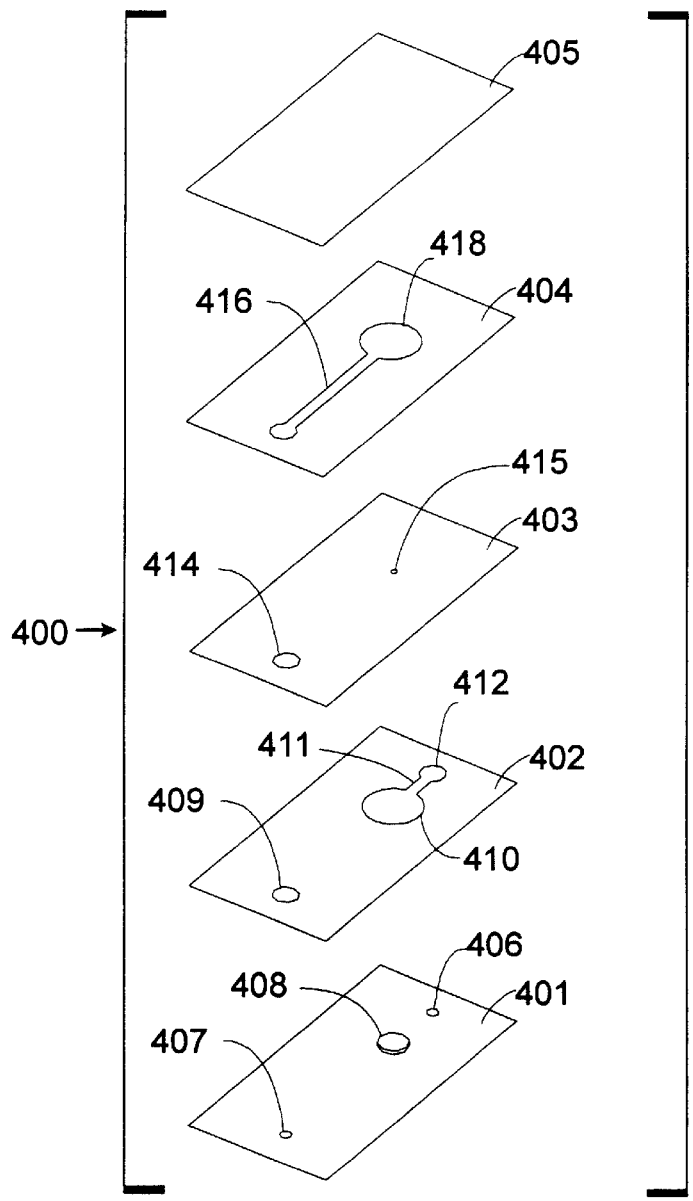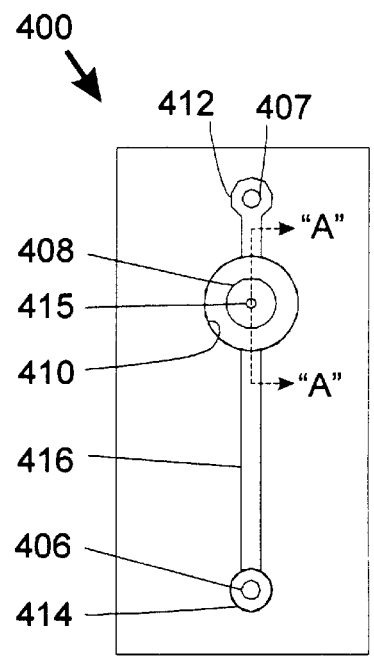
FIG._10A
FIG._10B

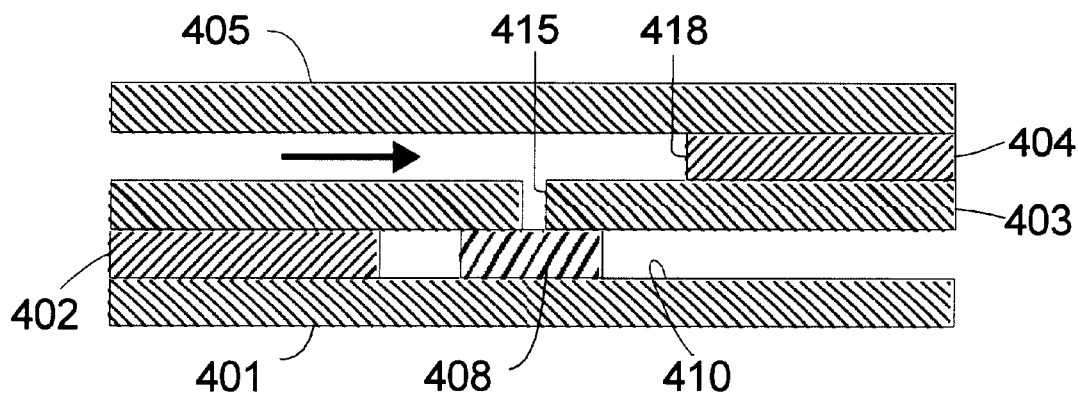
FIG._10C
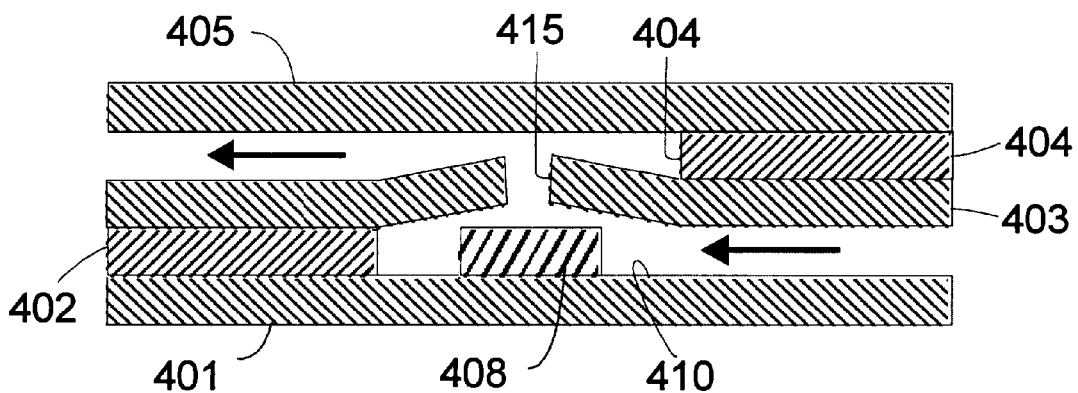
FIG._10D

MICROFLUIDIC DEVICES FOR HEAT TRANSFER

STATEMENT OF RELATED APPLICATION(S)

This application claims benefit of U.S. provisional application Serial No. 60/236,838, filed Sep. 29, 2000, the entire contents of which are incorporated herein by reference.

FIELD OF THE INVENTION

This invention relates to an apparatus and method for accomplishing heat transfer using microfluidic systems, such as may be useful for transferring heat to and from electronic devices and components thereof, including but not limited to computers, analytical instruments, lasers, other similar electronic instruments and apparatuses.

BACKGROUND OF THE INVENTION

At the outset, it should be noted that although the invention is described with reference to electronic equipment, particularly computers, the invention can be used in practically any application requiring heat transfer.

Many electrically-powered systems include environments having heat-producing elements contained within substantially enclosed areas. For example, within a typical computer system, the heat generated internally by certain components (such as integrated circuit (IC) devices, power supplies, motors, and transformers) may be substantial. This heat must be dissipated at a rate sufficient to maintain critical system components at acceptable temperatures in order to prevent premature component or system failure.

While small increases in operating temperature may not be immediately detrimental to the operation of electronic components, long-term operation at elevated temperature levels may adversely impact their longevity and reliability. This is particularly true for relatively sensitive integrated circuit or data storage devices, such as central processing units (CPUs) or disk drives, respectively, which may suffer disproportionate reductions in longevity with incremental increases in operating temperature. Moreover, the operating speed and reliability of many electronic systems suffers as the operating temperatures of their components rise. Additionally, mechanical effects resulting from wide variations in temperature and high peak temperatures may eventually induce component failures.

A conventional approach for providing heat transfer in computer systems is to cool the air inside a computer enclosure using a fan, which draws cold outside air into the enclosure. Because temperature-sensitive components such as ICs and disk drives typically act as significant heat sources, however, often this conventional approach is not sufficient to maintain air within the computer chassis at a temperature sufficiently below the maximum allowable temperature for these components, since each component may not dissipate heat effectively enough to maintain its temperature within acceptable limits. Additional localized (e.g. forced) cooling of these components often must be used to increase the rate of heat transfer.

Moreover, rising processor speeds and higher capacity circuits cause even greater thermal loads, thus requiring even more cooling air flow through enclosures to dissipate the attendant heat. In the past, conventional design wisdom has dictated that this increased cooling air flow be achieved by increasing the size and/or number of cooling fans within the housing. This, of course leads to several well-known and heretofore unavoidable problems, limitations and advantages such as: increased cost and complexity of the overall electronic apparatus; diminished space within the housing for additional operating components such as printed circuit boards, drives, etc.; increased operating fan and air movement noise; increased interference from electromagnetic radiation; and increased power consumption.

Specifically, as system electronics become more powerful, absent substantially increased cooling flow these electronic components can dissipate so much heat that they can create localized "hot spots" within an enclosure that make it very difficult to maintain thermal compliance for all of the electronics. Making matters worse, consumers have become more sensitive to noise and continue to demand quieter computers and electronic devices. This demand from consumers contradicts the need to increase air flow through the system to maintain thermal compliance. Efforts to improve thermal compliance issues have met with little success due to the rapid increase of electronic component power dissipation. Safety agencies limit the area that can be vented from a computer housing due to potential fire hazards. Thus, in the past, as electronic power dissipation has increased with the rise in processor speeds, so has cooling fan speed and size. Elevated fan speeds have resulted in decreased fan life, and the noise created by this approach has resulted in consumer complaints.

One approach for enhancing heat removal from localized areas or individual components such as ICs uses heat sinks, typically composed of a series of metal fins, that may be attached to component, preferably in close physical contact. Use of a heat sink permits (1) a larger heat transfer area to be used, and (2) heat to be drawn away from the component to another area. For example, a heat sink contacting an integrated circuit may project directly into a stream of cooling air such as may be provided by fans mounted on the walls of the case or on top of the heat sink. A forced flow of cooling air absorbs the heat from the heat sink and the resulting warmed air is blown outside the computer case.

A passive heat sink coupled with a fan, however, is often insufficient to provide adequate local cooling. The heat sink is typically placed next to a fan positioned to blow air out of the enclosure. Since air typically enters the enclosure case from a side opposite the fan, the air is usually pre-heated by other components within the system before reaching the heat sink to a level higher than the ambient air temperature. This can lower the cooling efficiency to such a point that the desired component (e.g., an integrated circuit) coupled to the heat sink may not get an appropriate amount of cooling. Since the desired component may not be totally cooled, the excess heat is typically dissipated throughout the enclosure causing the temperature of the enclosure to rise. In such systems the temperature of the enclosure may be up to 10 degrees Celsius higher than the ambient air temperature.

Moreover, certain electrical components used to increase computing speeds and characterized by particularly high power dissipation have required larger and larger heat sinks to keep the air flow requirements to reasonable levels. These heat sinks have grown to very large sizes in the past several years in order to keep fan speeds to a minimum. Many recent heat sink designs have exceeded the dimensional limits of the socket to which the electrical device is connected. This has caused problems for factories producing the systems, the designers of the system boards, and the end users. It has also caused difficulties for consumers seeking to upgrade their systems. For example, most modern microprocessors are designed to fit into a socket having an integral handle (e.g., a zif socket). To permit a processor to be inserted into, removed from, and locked within such a socket, the handle must be free to rotate up and down. Most heat sinks associated with these processors have exceeded the dimensional limits of the socket, thus causing the handle to be inaccessible. As a result, removing the processor becomes an onerous task once the heat sink is installed.

Another traditional approach to satisfying ever-increasing heat dissipation requirements has been to dramatically increase the size of an air inlet to an enclosure. Such inlets are commonly placed along the front plastic bezel of an enclosure. Increasing the size of an air inlet helps to increase air flow, but only to a certain degree since there is a limit as to how much the front side vents can be enlarged. Industrial designers generally desire to keep such inlets from becoming an eyesore for the consumer, and the visible vent area on a front bezel hampers the industrial designer's ability to provide a clean design that is aesthetically pleasing. Additionally, safety agencies refuse to approve or "list" enclosures having air inlets sized so large as to permit a user's finger to enter the device.

Therefore, there exists a great need for improved cooling systems for electronic equipment and similar devices. It would desirable to provide a solution for localized heating of components within electronic equipment that would cool the hottest components without dissipating the heat to other components. If accomplished, this should result in the further benefit of reducing the temperature of the enclosure surrounding the electronics due to reduced heat retention. Additionally, it would be desirable for a new cooling system to be characterized by low noise and also to be substantially free of electromagnetic interference or vibrations that might detrimentally impact system performance. Furthermore, it would be desirable for a new cooling system to be characterized by low power consumption, particularly when used in conjunction with battery-powered devices. The desirability of reducing power consumption ins particular acute in devices such as laptop computers, since air-cooling fans in such devices may consume up to 35% of the total available power, thus severely limiting battery life.

SUMMARY OF THE INVENTION

Microfluidic heat exchangers and heat exchange systems utilizing an internal working fluid and capable of transferring heat between high and low temperature regions are provided to perform functions such as cooling heat generating components of electronic equipment, computers, lasers, analytical instruments, medical equipment and the like. In such systems, heat is preferably transferred from a heat source to a heat sink using a circulating heat transfer fluid.

In a first separate aspect of the invention, a microfluidic heat exchange system for cooling an electronic component internal to a device such as a computer is provided. The heat exchange device is substantially in interfacial contact with a heat-generating electronic component and supplies an internal operating fluid a heat exchange zone. Operating fluid flows into the heat exchange zone at a first fluid temperature that is lower than the component temperature, and then exits the zone at a second fluid temperature higher than the first fluid temperature.

In a second separate aspect of the invention, a heat exchange system for affecting the temperature of an electronic component includes: a microfluidic heat exchanger having an inlet and an outlet wherein fluid enters at a inlet temperature and exits at an outlet temperature; a fluid circulation device for causing the fluid to flow through the exchanger; and a heat transfer device for returning the operating fluid to the heat exchanger at the inlet temperature.

In a further separate aspect of the invention, an electronic apparatus such as a computing device includes a housing or enclosure and a microfluidic heat exchange system.

In a further aspect of the invention, any of the foregoing aspects may be combined for additional advantage.

These and other aspects and advantages of the invention will be made apparent by reviewing the appended drawings and detailed description.

Definitions

The term "microfluidic" as used herein is to be understood, without any restriction thereto, to refer to structures or devices through which fluid(s) are capable of being passed or directed, wherein one or more of the dimensions is less than 500 microns. Microfluidic devices according to the present invention typically comprise channels, chambers, and/or reservoirs containing fluids for accomplishing heat transfer. Construction of microfluidic devices is described in co-pending applications, U.S. patent application Ser. Nos. 09/1550,184 and 09/453,029, the entire contents of which are incorporated herein by reference. Such disclosures are also provided in two WIPO PCT patent applications, nos. PCT/US00/27366 and PCT/US00/27313, which were published on Apr. 12, 2001.

The terms "channel" and "chamber" as used herein is to be interpreted in a broad sense. Thus, they are not intended to be restricted to elongated configurations where the transverse or longitudinal dimension greatly exceeds the diameter or cross-sectional dimension. Rather, such terms are meant to comprise cavities or tunnels of any desired shape or configuration through which liquids may be directed. Such a fluid cavity may, for example, comprise a flow-through cell where fluid is to be continually passed or, alternatively, a chamber for holding a specified, discrete amount of fluid for a specified amount of time. "Channels" or "chambers" may be filled or may contain internal structures comprising valves or equivalent components.

The term "stencil" as used herein refers to a preferably substantially planar material from which one or more variously shaped and oriented portions are cut (or otherwise removed) through the thickness of the material layer to form microstructures. The outlines of the cut or removed portions comprise the lateral boundaries of microstructures that are formed by sandwiching one or more stencil layers between other stencils and/or substrates.

The term "via" refers to a fluidic passage that permits fluid to flow between non-adjacent layers of a microfluidic device. A simple via may include an aperture defined in a device layer that is sandwiched between other layers. A via is preferably aligned with one or more fluidic channels, chambers, or other vias. A via may be smaller than, larger than, or the same size as channels or vias defined in one or more adjacent device layers.

BRIEF DESCRIPTION OF THE DRAWINGS

FIG. 1A is a block diagram showing a heat exchanger and a heat rejection system in thermal communication with a microfluidic channel. FIG. 1B is a more detailed schematic of the heat exchanger and a heat rejection system of FIG. 1A, the components being in thermal communication with a pump-driven microfluidic circuit.

FIG. 3 is a schematic illustrating a cooling network including multiple microfluidic coolers applied to a thermal source.

FIG. 4A is a top view of a printed circuit board having three discrete heat-generating regions. FIG. 4B is a top view of the printed circuit board of FIG. 4A having an on-board microfluidic cooling system.

FIG. 5A is an exploded perspective view of a four-layer microfluidic heat exchanger. FIG. 5B is a top perspective view of the microfluidic heat exchanger of FIG. 5A applied to a thermal source or sink and coupled to fluidic supply and return lines.

FIG. 6 provides plots of temperature vs. time for a heated aluminum block (upper plot) cooled with the microfluidic cooling device of FIGS. 5A–5B and a heat sink (lower plot)

FIG. 7A is an exploded perspective view of a five-layer closed-loop microfluidic cooling device having an integral pump. FIG. 7B is a top view of the assembled device of FIG. 7A.

FIG. 8 provides plots of temperature vs. time for a heated aluminum block (upper plot) cooled with the microfluidic cooling device of FIGS. 7A–7B and a heat sink (lower plot).

FIG. 9 is a block diagram illustrating a microfluidic thermal exchange system utilized to test two microfluidic heat exchange device according to the design of FIGS. 5A–5B.

FIG. 10A is an exploded perspective view of a five-layer microfluidic check valve device. FIG. 10B is a top view of the assembled valve device of FIG. 10A. FIG. 10C is a side sectional view of a portion of the valve device of FIGS. 10A–10B along section lines "A—A", showing operation of the valve to block flow in one direction. FIG. 10D provides the same view as FIG. 10C, but shows operation of the valve to permit flow in the reverse direction.

DETAILED DESCRIPTION OF PREFERRED EMBODIMENTS OF THE INVENTION

Figure 2A:
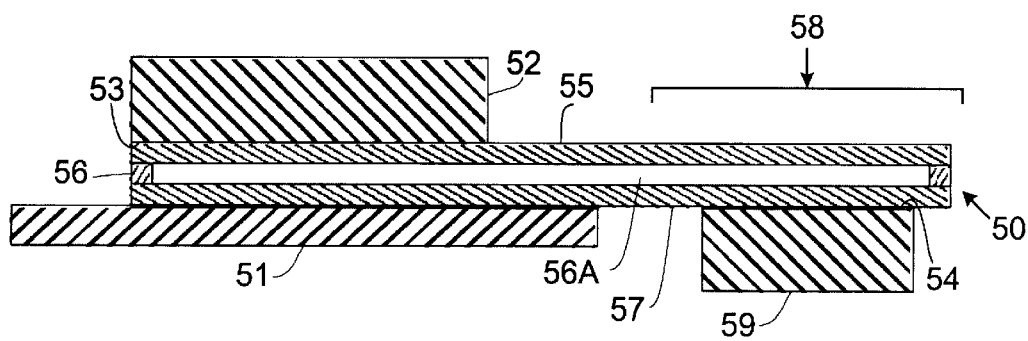
FIG. 2A is a cross-sectional schematic of an electronic component thermally coupled with a thermal sink across an indirect contact microfluidic heat exchange device.

The present invention includes the exchange of heat between a high-temperature region (such as an electronic component) and a low-temperature region (such as a heat sink) using a fluid flowing within a microfluidic heat exchange device. Further details of such devices follow a general description of how to fabricate such devices.

I. Fabrication of Microfluidic Devices

Microfluidic devices suitable for promoting thermal exchange according to the present invention may be fabricated in various ways using a wide variety of materials. In a preferred embodiment, microfluidic devices according to the present invention are constructed using stencil layers to define channels and/or chambers. As described in further detail in co-pending U.S. application Ser. No. 09/453,029, a stencil layer is preferably substantially planar and has a channel or chamber cut through the layer. For example, a computer-controlled plotter modified to accept a cutting blade may be used. Alternatively, a computer-controlled laser cutter may be used. As further alternatives, conventional stamping, cutting, and/or molding technologies may be employed. The wide variety of materials that may be used to fabricate microfluidic devices using sandwiched stencil layers include polymeric, metallic, and/or composite materials, to name a few. Thermally conductive polymers including polyimides (such as DuPont Kaptone® MT) may advantageously be used.

When assembled in a microfluidic device, the top and bottom surfaces of stencil layers may mate with one or more adjacent stencil or substrate layers to form a closed device.

In one embodiment, one or more layers of a device are comprised of single- or double-sided adhesive tape, although other methods of adhering stencil layers may be used. A portion of the tape (of the desired shape and dimensions) can be cut and removed to form channels, chambers, and/or apertures. A tape stencil can then be placed on a supporting substrate, between layers of tape, or between layers of other materials. In one embodiment, stencil layers can be stacked on each other. In this embodiment, the thickness or height of the channels can be varied by varying the thickness of the stencil (e.g. the tape carrier and the adhesive material thereon) or by using multiple substantially identical stencil layers stacked on top of one another. Various types of tape are useful with this embodiment. Suitable tape carrier materials include but are not limited to polyesters, polycarbonates, polytetrafluoroethlyenes, polypropylenes, and polyimides. Such tapes may have various methods of curing, including curing by pressure, temperature, or chemical or optical interaction. The thicknesses of these carrier materials and adhesives may be varied. For example, applicants have fabricated massive numbers of different sandwiched stencil-based devices using carrier materials for individual layers) varying in thickness between about 1 and 125 mils (25 to 3175 microns).

In another preferred embodiment, portions of microfluidic devices according to the present invention may be fabricated from materials such as glass, silicon, silicon nitride, quartz, or similar materials. Various conventional machining or micromachining techniques such as those known in the semiconductor industry may be used to fashion channels, vias, and/or chambers in these materials. For example, techniques including wet or dry etching and laser ablation may be used. Using such techniques, channels, chambers, and/or apertures may be made into one or more surfaces of a material or penetrate through a material. While materials such as glass, silicon, silicon nitride, and quartz are thermal insulators, they may be used in microfluidic heat transfer devices when used in conjunction with other, thermally conductive materials. For instance, microfluidic channels may be etched in silicon layers and later covered with a thermally conductive sealing layer to promote heat transfer with an external heat source or sink. Alternatively, channels formed in a glass, silicon, silicon nitride, or quartz layer may be sealed directly against a heat source or heat sink to promote direct contact between heat transfer fluid and the source or sink.

Still further embodiments may be fabricated from various materials using well-known techniques such as embossing, stamping, molding, and soft lithography. Thermally conductive materials may advantageously be used to promote heat transfer between fluid contained within a microfluidic device and an external heat source or sink across the conductive layer(s). Alternatively, heat sources or sinks may be directly attached or bonded to the devices to promote direct contact between fluid in the microfluidic device and the source or sink.

In addition to the use of adhesives or single- or double-sided tape discussed above, other techniques may be used to attach one or more of the various layers of microfluidic devices useful with the present invention, as would be recognized by one of ordinary skill in attaching materials. For example, attachment techniques including thermal, chemical, or light-activated bonding; mechanical attachment (such as using clamps or screws to apply pressure to the layers); or other equivalent coupling methods may be used.

II. Microfluidic Heat Exchange System and Devices

In one embodiment, shown in FIG. 1A, a microfluidic heat exchange system 10 includes a microfluidic heat exchanger (e.g., a cooler) 20 in contact with the electronic component to be cooled (not shown), a heat rejection device 21 and channels 22 that fluidically (and thermally) connect the exchanger and rejection system. The heat exchanger 20 is in thermal communication with the electronic component, preferably by being substantially in interfacial contact with the component. The operating fluid exits the heat rejection device 21 at a first temperature T1 and enters the microfluidic heat exchanger 20. Because the first temperature T1 is lower than the temperature of the electronic component to be cooled, as the operating fluid flows through the heat exchanger 20, it picks up heat from the electronic component and exits the exchanger 20 at a second temperature T2, which is higher than T1. The operating fluid then enters the heat rejection device 21, where heat drawn from the device is rejected to a heat sink (not shown) that preferably is in thermal communication with an environment remote from the electronic component, such as, for example, ambient air. The heat rejection device 21 cools the operating fluid down to temperature T1, at which time the fluid is ready to be returned to the microfluidic heat exchanger 20. The heat rejection device 21 may include multiple components, such as a radiator-type apparatus thermally coupled with a cooling fan (not shown).

Referring to FIG. 1B, a microfluidic heat exchange system 10 includes a fluid channel 24 that circulates operating fluid through the heat exchanger 20. The heat exchanger 20 is in thermal communication with an electronic component 30 that generates heat. In this embodiment, a pumping mechanism 25 is added to the system 10 to force the operating fluid to flow through the heat exchanger 20 and through a heat rejection device 21. This pumping mechanism 25 may be provided in various forms such as an off-board pump, an on-board microfluidic pump, and/or an electrokinetic pumping apparatus. Pumping mechanisms that may operate with devices according to the present invention include but are not limited to compressed air, peristaltic pumping, piston driven pumping, vacuum driven pumping, electrokinetic pumping, electrophoretic pumping, and thermal driven pumping. An enclosure 35, such as a conventional protective housing used to contain a personal computer or other electronic device, may be provided to contain the electronic component 30, the heat exchanger 20, and (optionally) the pumping mechanism 25. The heat rejection device 21 may be located inside the enclosure 35 surrounding the electronic component 30 to be cooled or, more preferably it may be located remotely. Preferably, the heat rejection device 21 is in thermal communication with an environment outside the enclosure 35 to minimize thermal dissipation within the enclosure 35.

In one embodiment, an operating fluid transfers heat between a microfluidic heat exchanger and an electronic component across a thermally conductive portion of the exchanger. Referring to FIG. 2A, an indirect transfer microfluidic heat exchanger 50 mounted to a structural support 51 is in thermal communication with both an electronic component 52 to be cooled and a heat sink 59. Examples of heat-generating electronic components 52 include circuit boards, microprocessors, and other integrated circuits. Preferably, the heat exchanger 50 is disposed in interfacial contact with the component 52, such as by pressing, adhering, or otherwise attaching at least a portion of the exchanger 50 directly to the electronic component 52. Thermal exchange between the exchanger 50 and the heat sink 59 is preferably made by similar interfacial contact.

The microfluidic heat exchanger 50 is shown in three layers 55, 56, 57, defining internal fluid channels 56A that contain operating fluid. Preferably, the outer layers 55, 57, or at least the portions thereof in interfacial contact with the electronic component 52 and heat sink 59, respectively, are made of thermally conductive materials. Metals such as aluminum or copper, for example, may be used to ensure a low thermal resistance between the hot electronic component 52 and the operating fluid in channels 56A. Other thermally conductive materials may be used. The boundary portion of the upper layer 55 that directly contacts the component 52 along surface 53 and transmits heat to the operating fluid defines a heat exchange zone within the exchanger 50. In this zone, heat is transferred across the layer 55 from the component 52 to the operating fluid. That is, heat from the bottom surface of the electronic component 52 is conducted through the upper layer 55 and convected to the operating fluid in the microfluidic channels 56A. Similar heat exchange occurs between the operating fluid and the heat sink 59 at the opposite end of the microfluidic heat exchanger 50. There, heat from the operating fluid is convected to the lower layer 57 of the device 50 along the interface 54 with the lower-temperature heat sink 59. The combination of the heat sink 59 and proximate portions of the heat exchanger 50 and fluidic channels 56A may also be termed a heat rejection system 58. Although not visible in this particular view, channels 56 preferably form a loop-type fluidic circuit to promote continuous thermal exchange between the electronic component 52 and the heat sink 59.

In operation, operating fluid at temperature T1 flows from the heat rejection system through channels 56A of the microfluidic cooling chip toward the electronic component 52 and the heat exchange zone, absorbs heat from the component 52 is conducted across the wall 55 of the exchanger 50 to the operating fluid. As the operating fluid travels past the cooling component 52 and exits the heat exchange zone, the fluid is heated to a temperature T2. Parameters including fluid flow rate, fluid heat capacity, and temperature T1 of the cooling fluid (dictated by thermal exchange with the heat sink 59) are selected such that the electronic component 52 is maintained at a desirable temperature. In a preferred embodiment, the fluid is pumped through the microfluidic heat exchanger 58, such as by using a peristaltic or other pump. After absorbing heat from component 52, the operating fluid at temperature T2 flows through the channels 56A through the heat rejection system 58. There, heat is convected from the operating fluid to the lower layer 57, through which it is conducted to the heat sink 59. Notably, a portion of the heat borne by the operating fluid may not only be transferred to the sink 59, but also dissipated to the environment surrounding the microfluidic heat exchanger 50. Thus, in many cases it is appropriate to include elements other than the heat sink 59 in the heat rejection system 58.

In a preferred embodiment, the heat sink 59 includes a series of metal fins designed to provide a large heat transfer area within a small volume. Because the cooling fluid carries the heat away from the component 52, the heat sink 59 can be located remotely from the component 52, circumventing a problem with conventional cooling systems wherein heat sinks mounted directly to the electronic components exceed the dimensional bounds of the component socket causing substantial difficulties in removing and swapping such components. Additionally, heat rejection in the sink 59 can be enhanced by blowing air past the sink, for example, using a cooling fan. Once again, because the heat sink 59 can be located remotely from the electronic component 52, problems associated with transmitting vibration and electromagnetic interference from a rotating fan to sensitive electronic components may be reduced or eliminated by certain embodiments of the present invention.

In another embodiment utilizing a microfluidic heat exchange system, thermal exchange in a heat sink may be aided by a thermoelectric cooler. In such an embodiment, the cold side of the thermoelectric cooler may be placed in thermal communication with a microfluidic heat exchanger. In a preferred variant, a microfluidic cooler is placed in direct interfacial contact with a microfluidic heat exchanger.

As would be recognized to one of ordinary skill in the art, heat transfer between an electronic component and the operating fluid, and similarly between the operating fluid and a heat sink, can be optimized by appropriate choice of the materials of construction. For example, all or part of a microfluidic heat transfer system can be fabricated out of materials that are good thermal conductors. In this manner, thermal energy can be directed from the heat source, into a conducting portion of the device and from there to the fluid with minimal conductive resistance. Once this thermal energy is absorbed by the operating fluid, the fluid may be circulated through a thermally insulating portion of the exchanger to another thermally conductive portion for where heat may be readily transferred to a thermal sink. For example, the portion of the microfluidic heat exchanger defining a heat exchange region adjacent to the interface with the electronic component and the portion in thermal communication with the heat sink may be constructed using copper, aluminum foil or a conducting polymer whereas the rest of the microfluidic chip may be constructed from a thermally insulating polymer or other insulator such as glass or silicon. Similarly, the cooling fluid may also be selected to optimize heat transfer. In a preferred embodiment, the cooling fluid is a thermally conductive liquid.

Figure 2B:
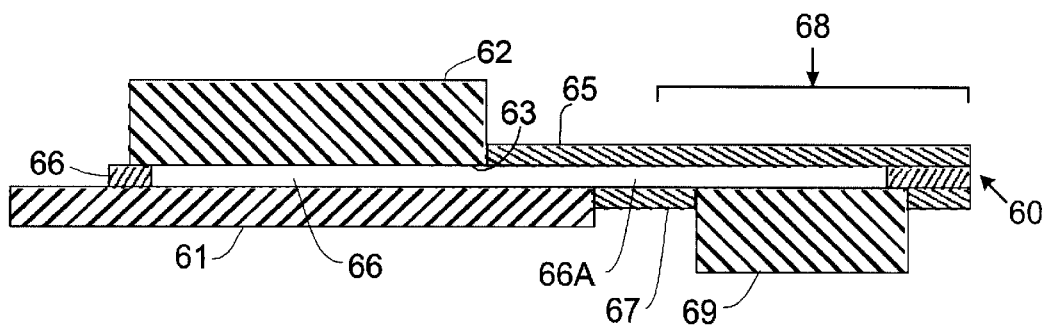
FIG. 2B is a cross-sectional schematic of an electronic component thermally coupled with a thermal sink across a direct contact microfluidic heat exchange device.

In another embodiment, an operating fluid within a microfluidic heat exchanger directly contacts at least a portion of an electronic component without a thermally conductive intermediate layer. Referring to FIG. 2B, a microfluidic heat exchanger 60 connected to a structural support 61 is in thermal communication with an electronic component 62 to be cooled and a heat sink 69. In this embodiment, microfluidic channels 66A are bounded and sealed not only by layers 65, 66, 67 of the device 60, but also by a the lower surface 63 of the electronic component 62 and the upper surface of the heat sink 59 which serves as part of the heat rejection system 68. This is accomplished by removing portions of layers 65, 67 as compared to the comparable layers in the microfluidic exchanger 50 of FIG. 2A. Additionally, a portion of the structural support 61 serves to define the channels 66A. As compared to the heat exchanger 50 in the previous example, the heat exchanger 60 promotes improved heat transfer between the operating fluid on the one hand and the component 62 and the heat sink 69 on the other due reduced conductive resistance (such as through the outer layers 55, 57 of the microfluidic heat exchanger 50). Other than the reduced conductive resistance, operation of the microfluidic exchanger 68 proceeds substantially the same as in the previous example to transfer heat between the electronic component 62 and the heat rejection system 68 substantially in heat sink 69) by way of the operating fluid.

In a microfluidic heat exchange system such as illustrated in FIG. 2B, the operating fluid may be air or another gas. In such an embodiment, natural convection may provide sufficient thermal exchange to avoid the need for a closed-circuit circulation. Thus, cool air from the ambient environment, preferably outside an enclosure surrounding the heat-generating electronic component, can be pumped through the channels 56 and 57 to the component 52 and then exhausted outside the enclosure. In such a system, microfluidic channels may be used mainly to target the cooling medium to specific components instead of the entire inner volume of the enclosure.

In a further embodiment, multiple microfluidic heat exchangers are used in combination to provide enhanced heat exchange utility. For example, FIGS. 3 and 4B illustrate arranged in network configurations. Referring to FIG. 3, a heat exchange network 199 utilizes microfluidic heat exchangers 203 carrying an operating fluid to exchange heat between heat-generating electronic components 202 and a heat rejection system 200. Preferably, the heat exchangers 203 are in close interfacial contact with the electronic components 202 to readily promote heat transfer between the components 202 and the working fluid. A pumping system 205 maintains flow of the operating fluid through channels 204, through the microfluidic heat exchangers 203 and into heat rejection system 200. Such a network configuration beneficially permits a common heat sink 200 and pumping system 205 to be provided for multiple heat-generating components 202. Additionally, the heat transferred to the operating fluid by one or more electronic component 202 may be used to supply pumping energy for the pumping system 205. Such a system may advantageously be applied to several components 202 on a common circuit board, for example.

A printed circuit board 210 having heat-generating components 1, 2, and 3 is provided in FIG. 4A. FIG. 4B shows a similarly-configured circuit board 220, but including a microfluidic cooling network overlayed onto the board to provide interfacial contact between a microfluidic heat exchange channels 211, 212, 213 and the printed circuit board 220. The heat exchange channels 211, 212, 213 circulate fluid at a first temperature from a pump and thermal sink 215 to multiple heat-generating components so as to absorb thermal energy, and then deliver this energy to the thermal sink 215 where it is advantageously dissipated remotely from the electronic components. Notably, the microfluidic heat exchange channels 211, 212, 213 may be provided in a serpentine arrangement to provide increased heat transfer area yet avoid selected areas on the circuit board 220. The heat exchange channels 211, 212, 213 may be added to the board 220 using methods previously described herein (e.g., using sandwiched stencil layers) following the board's manufacture, or advantageously manufactured integrally into the circuit board 220 using methods such as, but not limited to, conventional etching and material deposition methods. While the particular configuration of the board 220 shown in FIG. 4B show the pump and sink block 215 located on the board 220, in alternative embodiments the pump and sink 215 may be located remotely from the printed circuit board 220 while in fluidic and thermal communication with the heat exchange channels 211, 212, 213.

In certain embodiments, microfluidic heat exchange devices may utilize microfluidic reservoirs to provide increased heat transfer area. Referring to FIG. 5A, for example, a microfluidic heat exchange device 250 is constructed from four stencil layers 251–254. The top layer 251 serves as a cover; the second layer 252 defines channels 254, 255; the third layer 253 defines four through-holes or vias 256–259; and the fourth layer 254 defines inlet and outlet ports 260, 261 and a fluidic reservoir area 262. In the particular illustrated embodiment, the reservoir 262 is open at the bottom to permit direct contact between the operating fluid and a desired heat transfer surface. Alternatively, a further (fifth) layer of heat-conductive tape may be placed between the reservoir 262 and a desired heat transfer surface if direct contact between the operating fluid and the heat transfer surface is desired. In such a case, thermal transfer would occur from the heat transfer surface, through the layer of tape, and into the operating fluid. A conductive separating layer with appropriate thermal conduction properties may be selected. In the embodiment shown in FIG. 5A, the layers containing the reservoir and the channels are made of 0.5 mil (12 micron) thickness polyester tape, having an integral acrylic adhesive on both sides. The other two layers are made of 2 mil (50 micron) thick PET. The assembled device 250 is shown in FIG. 5B, having an inlet tube 263 and an outlet tube 264 attached to permit fluidic exchange with a heat dissipation system (not shown). The device 250 is further mounted to a controllable heat source 265 for experimental purposes. In use, the device 250 would be mounted to an electronic component for which cooling is desired (e.g., an integrated circuit such as a microprocessor) instead of a controllable heat source 215.

Microfluidic heat exchange devices according to the design 250 shown in FIGS. 5A–5B were constructed and tested using an experimental apparatus. A schematic of the apparatus 270 is provided in FIG. 9. Two heat exchange devices 250A and 250B were constructed and each were directly adhered to individual aluminum blocks 280, 290 having separate volumes of approximately 4 cm$^3$. No intermediate layers were provided between the devices 250A, 250B and the corresponding blocks 280, 290; rather, fluid within each heat exchange device 250A, 250B was permitted to directly circulate against the blocks 250A, 250B. The area of each reservoir region (reservoirs 262) was about 2.7 cm$^2$, and the channels (i.e., channels 254, 255) provided on the devices 250A, 250B were 80 mils wide. The first block 280 further contacted a 5 W thermoelectric heat source 281 connected to a power source 283. The second block 290 was stacked atop a massive aluminum heat sink having very low thermal resistance. Thermocouples 282, 292 were coupled to each block 280, 290. An external "Polystaltic" peristaltic pump (Buchler Instruments) 275 and fluidic lines 272 were provided to pump operating fluid through the first exchanger 250A and the second exchanger 250B in a closed loop. The total fluid volume contained within the apparatus 270 was about 30 mL.

The test was initiated by activating the heater 281 without activating the pump 275. Within a period of about 45 minutes, the first block 280 was heated to a constant temperature of approximately 70 degrees C. Once the temperature was stabilized, the pump 275 was activated and provided a flow rate of about 4 ml/min. The temperatures of both aluminum blocks 280, 290 were recorded as a function of time, and are provided in FIG. 6.

The upper plotted line in FIG. 6 is the temperature of the first (heated) block 280. The lower plotted line represents the temperature of the second (sink) block 290. Substantial changes in temperature for both blocks 280, 290 were recorded starting at the 45 minute period when the pumping mechanism 275 was activated. Almost immediately after the pumping mechanism 275 was switched on, the temperature of the heated element fell to about 40 degrees C. while the heat sink temperature rose to approximately 32 degrees C. Both temperatures stayed constant over the remaining time of the experiment.

In certain embodiments, operating fluid in a microfluidic heat exchange system device may be circulated with one or more peristaltic pumps. Such pumps usually rely upon physical displacement such as may be provided across a flexible membrane to provide the motive force. When peristaltic pumps are used, unidirectional (check) valves may be advantageously employed to direct the flow in a particular direction and promote pumping efficiency.

One type of a microfluidic check valve is illustrated in FIGS. 10A–10C. Referring to FIG. 10A, a microfluidic check valve device 400 is formed in five layers 401–405. Starting from the bottom, the first layer 401 defines a fluid inlet port 406 and an outlet port 407. The first layer 401 further supports a raised valve seat 408 that is approximately equal in height to the thickness of the second layer 402. The second layer 402 defines a channel 411 having a flared end 412 and widening into a chamber 410 centrally aligned with the valve seat 408 supported by the first layer 401. The second layer further defines a via 409. The third layer 403 defines a small via 415 substantially centrally aligned above the chamber 410 and valve seat 408 in the preceding layers, and further defines a large via 414. The fourth layer 404 defines a channel 416 terminating at a chamber 418.

While various materials may be used for several elements of the device 400, preferably the third layer 403 is fabricated from a flexible material to permit localized deformation of the membrane in the vicinity of the chamber 418 in response to certain flows. The valve seat can be constructed from any suitable material or combination of materials. The valve seat can be formed as an integral part of the device or can be affixed to the device within the channel. In one embodiment, the valve seat can be single-side adhesive tape, or double-sided adhesive tape with a membrane on top. It can also be a raised portion of the substrate, which can be machined, molded, etched, or hot-pressed. The valve seat can be of any shape that allows for the formation of a seal with the flexible membrane when sufficient pressure is applied from the outlet channel. The size and shape of the valve seat can be chosen to be compatible with that of the aperture in the membrane.

Representative examples of the check valve illustrated in FIGS. 10A–10B have been constructed from double-sided rubber-adhesive 6-mil (150 micron) thickness polypropylene tape and 2-mil (50 micron) thickness polyethylene terephthalate (PET) for the flexible third layer 403. The valve seat 408 was a 0.15" diameter 0.0035" thick piece of double-sided acrylic-adhesive polyester tape, with a layer of latex bound to the top; the total valve seat height was roughly 0.006".

FIGS. 10C–10D provide cross-sectional views of a portion of the check valve device 400 along section lines "A—A" to illustrate operation of the device 400. In the first example provided in FIG. 10C, fluid is introduced to the device 400 through the outlet port 407. From the port 407, the fluid travels through vias 409 and 414 into the channel 416 and into the chamber 418. From the chamber 418, further flow is blocked by the membrane 403 pressed against the valve seat 408. The higher the pressure within the chamber 418, the greater sealing force will be exerted against the seat 408. Thus, fluid flow in this direction cannot pass.

In the second example provided in FIG. 10D, fluid is introduced to the device 400 through the inlet port 406. From the port 406, fluid passes through the region 412, through the channel 410 and into the chamber 410 surrounding the valve seat 408. When the fluid reaches the valve seat 408 it builds slight pressure that causes the flexible membrane 403 (which may be fabricated from materials such as 2-mil (50 micron) thickness PET) above the chamber 410 to deflect upward. Upon upward deflection of the stencil membrane 403, flow is permitted to pass through the aperture 415, into the channel 416, and ultimately through the vias 414, 409, and the exit port 407. Thus, a uni-directional check valve is provided that permits fluid flow in one direction only.

In another embodiment, multiple components such as one or more heat exchangers, pumps, and/or valves may be integrated into a single microfluidic device. For example, referring to FIGS. 7A–7B, a microfluidic heat transfer device 299 having an integral pumping reservoir 318, two check valves (e.g. adjacent to valve seats 314, 315), and two heat exchange reservoirs 312, 313 are provided. Referring to FIG. 7A, the device 299 is constructed in five layers of seven sections 300–306 including stencil layers 301, 302, 303, and 305. The topmost layer 300 serves as a cover for fluid contained in the channels of the second layer 301. The second stencil layer 301 defines channels 306–308 and a pumping reservoir 318 for interfacing with a piston (not shown) to provide peristaltic pumping utility. The third stencil layer 302 defines through-holes or vias 309, 309A of different dimensions. The fourth stencil layer 303 defines check valve channels 310, 311 and reservoir regions 312, 313. Cover sections 304, 306 are used to cover the reservoirs 312, 313. The fifth stencil layer 305, which is shorter in length than the layers 300–303, is formed of a rigid material to provide solid support and defines fill ports 316, 317 and raised valve seat regions 314, 315. Once assembled, the device 299 is filled with fluid through inlet 316, which drives air from the device 299 through port 317. After the device 299 is filled with fluid, the inlet ports 316 and 317 may be capped, making the device hermetically sealed. The dimensions and materials for the device 299 are substantially similar to the device 250 shown in FIGS. 5A–5B, with the exception of the fifth (bottom) layer. In the device 299, the bottom layer is made of three parts; the fifth stencil layer 305 is preferably a rigid acrylic plate to serve as the platform for the pump, and contains the raised valve seats 314, 315 for the one-way (check) valves. The cover sections 304, 306 seal the reservoirs 312, 313 and are preferably single-sided heat conductive tape composed of a DuPont Kaptone® carrier and an acrylic adhesive. Other thermally conductive materials including metallic foils may be used.

The device 299 was constructed and tested. 800 microliters of coolant (water including food dye to enhance visibility) were provided to the device 299. The device 299 was connected to two aluminum blocks, one being connected to a 5 W thermal load and the other to a massive heat sink. The effective area of contact of the fluid with the heat sink was 3.1 square centimeters. A variable frequency, variable amplitude piston device with a total travel of approximately 3 millimeters (±1.5 mm relative to a static position) was adhered to the cover layer in the center of the pumping region using an adhesive to providing peristaltic pumping action. Integral check valves ensured that flow proceeded in a single direction. Heating without pumping was initiated for a period of about 40 minutes until the first block was heated to a steady-state temperature of approximately 54 degrees C. The pump was then started, and a frequency of 14 strokes per minute was maintained for the duration of the experiment. The temperature of each aluminum block was recorded throughout. Experimental results showing temperature as a function of time are plotted in FIG. 8. The upper plotted line represents the temperature of the heated block; the lower plot represents the temperature of the heat sink. Both temperatures stayed constant over the remaining time of the experiment, with the exception of an aberration at approximately 1.5 hours into the experiment when contact was temporarily lost between the thermoelectric heater and the aluminum block. Both sets of results shown in FIG. 6 and FIG. 8 demonstrate the efficacy of microfluidic thermal exchange devices according to the present invention.

It is to be appreciated that the foregoing description of the invention has been presented for purposes of illustration and explanation and is not intended to limit the invention to the precise manner of practice herein. It is to be appreciated, therefore, that changes may be made by those skilled in the art without departing from the spirit of the invention, and that the scope of the invention should be interpreted with respect to the following claims and their legal equivalents.

What is claimed is:

1. A heat exchange system for cooling an electronic component, the system comprising:

a microfluidic heat exchange device containing an operating fluid in thermal communication with the electronic component, the microfluidic heat exchange device being fabricated with a plurality of device layers including a stencil layer having a thickness and defining a microfluidic channel or chamber through the entire thickness of the stencil layer, wherein at least one device layer of the microfluidic heat exchange device comprises a self-adhesive tape material, the microfluidic heat exchange device further having a fluidic inlet and a fluidic outlet in fluid communication with the microfluidic channel or chamber such that the operating fluid enters the fluidic inlet at an inlet temperature and exits the fluidic outlet at an outlet temperature; and a heat rejection apparatus fluidically coupled to the microfluidic heat exchange device, the heat rejection apparatus being adapted to receive the operating fluid at substantially the outlet temperature and return the operating fluid to substantially the inlet temperature.

2. The system of claim 1 wherein at least one device layer of the microfluidic heat exchange device comprises a polymeric material.

3. The system of claim 1 wherein the microfluidic heat exchange device is adhered to the electronic component.

4. The system of claim 1 wherein the microfluidic heat exchange device is removably adhered to the electronic component.

5. The system of claim 1 wherein the operating fluid directly contacts the electronic component.

6. The system of claim 1, further comprising an enclosure, wherein the electronic component is disposed substantially within the enclosure and the heat rejection apparatus is in thermal communication with an environment outside the enclosure.

7. The system of claim 1, further comprising a fluid circulation device for causing the operating fluid to flow through the microfluidic heat exchange device.

8. The system of claim 1 wherein the electronic component comprises an integrated circuit affixed to a circuit board, and the microfluidic heat exchange device is distinct from the circuit board.

9. The system of claim 1 wherein the heat rejection apparatus comprises a thermoelectric cooler.

10. The system of claim 1 wherein the operating fluid is a liquid.

* * * * *

UNITED STATES PATENT AND TRADEMARK OFFICE
CERTIFICATE OF CORRECTION

PATENT NO. : 6,501,654 B2  Page 1 of 1
DATED : December 31, 2002
INVENTOR(S) : O'Connor, Stephen D. et al.

It is certified that error appears in the above-identified patent and that said Letters Patent is hereby corrected as shown below:

Column 3,
Line 22, the phrase "It would desirable" should read -- It would be desirable --
Line 35, the phrase "power consumption ins" should read -- power consumption is --

Column 5,
Line 26, the phrase "heat exchange device according to" should read -- heat exchange devices according to --

Column 6,
Line 22, the phrase "individual layers) varying" should read -- individual layers varying --

Column 9,
Line 22, the phrase "thermally conductive portion for where" should read -- thermally conductive portion where --
Line 43, the phrase "also by a the lower surface" should read -- also by the lower surface --
Line 53, the phrase "other due reduced conductive resistance" should read -- other due to reduced conductive resistance --

Signed and Sealed this

Twenty-second Day of June, 2004

JON W. DUDAS
*Acting Director of the United States Patent and Trademark Office*